(12) United States Patent  
Hikita et al.

(10) Patent No.: US 7,009,294 B2  
(45) Date of Patent: Mar. 7, 2006

(54) PRODUCTION PROCESS FOR SEMICONDUCTOR DEVICE

(75) Inventors: Junichi Hikita, Kyoto (JP); Kazutaka Shibata, Kyoto (JP); Shigeyuki Ueda, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 122 days.

(21) Appl. No.: 10/748,327

(22) Filed: Dec. 31, 2003

(65) Prior Publication Data

US 2004/0152236 A1 Aug. 5, 2004

Related U.S. Application Data

(62) Division of application No. 09/511,800, filed on Feb. 23, 2000, now Pat. No. 6,696,347.

(30) Foreign Application Priority Data

Feb. 23, 1999 (JP) ................................. 11-045214

(51) Int. Cl.
 *H01L 23/48* (2006.01)

(52) U.S. Cl. ...................... 257/737; 257/773; 257/775; 257/780

(58) Field of Classification Search ................ 257/737, 257/738, 773, 775, 780, 784, 785, 786; 438/612, 438/613, 616
See application file for complete search history.

(56) References Cited

U.S. PATENT DOCUMENTS

| 4,855,251 A | * | 8/1989 | Iyogi et al. ................. 438/616 |
| 5,310,699 A |   | 5/1994 | Chikawa et al. ............ 437/183 |
| 5,336,547 A | * | 8/1994 | Kawakita et al. ........... 257/737 |
| 5,492,863 A |   | 2/1996 | Higgins, III ................ 437/183 |
| 5,607,099 A | * | 3/1997 | Yeh et al. ............. 257/E21.508 |
| 5,646,068 A |   | 7/1997 | Wilson et al. .............. 438/108 |
| 5,808,360 A |   | 9/1998 | Akram ....................... 257/738 |
| 5,984,164 A |   | 11/1999 | Wark .......................... 228/164 |
| 6,008,071 A |   | 12/1999 | Karasawa et al. .......... 438/115 |
| 6,057,168 A | * | 5/2000 | Seyama et al. ............. 438/616 |
| 6,117,759 A |   | 9/2000 | Greer et al. ................ 438/616 |
| 6,294,909 B1 |   | 9/2001 | Leedy .................... 324/207.17 |
| 6,409,073 B1 |   | 6/2002 | Kaskoun et al. ........ 228/180.22 |

* cited by examiner

*Primary Examiner*—Kevin M. Picardat
(74) *Attorney, Agent, or Firm*—Rabin & Berdo, P.C.

(57) ABSTRACT

A production process for a semiconductor device having a metal electrode on a semiconductor substrate thereof. A metal electrode portion is formed on a surface of another substrate for electrode transfer. Then, the metal electrode portion is transferred from the electrode transfer substrate onto the semiconductor substrate by pressing together the electrode transfer substrate and the semiconductor substrate. The electrode transfer substrate has, for example, a seed film provided on the surface thereof, and the formation of the metal electrode portion on the electrode transfer substrate may be achieved by depositing a material for the metal electrode on the seed film by plating. The electrode transfer substrate may have an insulating film which covers a surface of the seed film except a portion thereof on which the metal electrode portion is to be formed.

7 Claims, 4 Drawing Sheets

PRODUCTION PROCESS FOR SEMICONDUCTOR DEVICE

This application is a divisional of application Ser. No. 09/511,800, which was filed on Feb. 23, 2000 now U.S. Pat. No. 6,696,347.

BACKGROUND OF THE INVENTION

1. Field of the Invention

The present invention relates to a production process for a semiconductor device having metal electrodes such as bumps provided on its surface.

2. Description of Related Art

Some of semiconductor chips have metal electrodes such as bumps projecting from a surface thereof. For example, such a semiconductor chip may be mounted on a printed wiring board by flip-chip bonding, or bonded to another semiconductor chip in a stacked relation to form a semiconductor device of chip-on-chip structure.

In general, the semiconductor chip has an insulating film and an aluminum interconnection film provided on a surface of a semiconductor substrate which serves as a base thereof, and connection pads for external electrical connection provided in proper positions on the surface thereof. A protective film covering the outermost surface of the semiconductor substrate is formed with openings which expose the connection pads therethrough.

A process for forming the bumps generally comprises the steps of: forming a seed film on the entire surface of a wafer formed with a protective film; forming on the seed film a resist film having openings just above the connection pads by patterning; and selectively depositing a metal material for the bumps to a great thickness in the openings formed in the resist film. Thereafter, the resist film is removed, and then the seed film except bump portions thereof is removed. Thus, island-like bumps electrically connected to the respective connection pads are provided.

As can be understood from the foregoing, the formation of the bumps requires complicated steps such as the formation of the resist film on a wafer-by-wafer basis, so that the process involves an increased number of steps thereby hindering the reduction in the production cost of the semiconductor chip.

SUMMARY OF THE INVENTION

It is an object of the present invention to provide a production process for a semiconductor device which allows for cost reduction by simplifying the step of forming metal electrodes.

The process according to the present invention is a production process for a semiconductor device having a metal electrode provided on a semiconductor substrate thereof, and comprises the steps of: forming a metal electrode portion on a surface of another substrate for electrode transfer; and transferring the metal electrode portion from the electrode transfer substrate onto the semiconductor substrate by pressing together the electrode transfer substrate and the semiconductor substrate.

In accordance with the invention, the metal electrode portion is formed on the electrode transfer substrate, and then transferred from the electrode transfer substrate onto the semiconductor substrate. Therefore, the step of forming a resist film on the surface of the semiconductor substrate and the step of patterning a seed film on the surface of the semiconductor substrate can be obviated.

The electrode transfer substrate allows for repetitive formation of the metal electrode portions thereon and, hence, can repeatedly be used for a plurality of semiconductor substrates. Therefore, the production process for the semiconductor device is totally simplified thereby to allow for cost reduction.

In accordance with one embodiment of the invention, the electrode transfer substrate has a seed film provided on the surface thereof, and the step of forming the metal electrode portion on the electrode transfer substrate comprises the step of depositing a material for the metal electrode on the seed film by plating.

More specifically, the metal electrode portion is formed by depositing the metal material on the seed film on the electrode transfer substrate by plating (electroplating or electroless plating). In this case, the electrode transfer substrate formed with the seed film can be used again for formation of a metal electrode portion for the next semiconductor device immediately after the metal electrode portion is transferred onto the semiconductor substrate. The formation of the metal electrode on the semiconductor substrate is thus achieved by the formation of the metal electrode portion on the electrode transfer substrate by plating and the transfer of the metal electrode portion onto the semiconductor substrate, thereby drastically simplifying the process as compared with the prior art.

The electrode transfer substrate is preferably covered with a patterning film which exposes therefrom a portion of the seed film in an electrode portion forming position. Thus, the metal electrode material can be deposited only on the properly exposed portion of the seed film. This obviates the need for formation and subsequent removal of a patterning film for pattern-formation of the metal electrode portion on the semiconductor substrate, thereby further simplifying the process.

The electrode transfer substrate preferably has an insulating film which covers the seed film except the portion thereof in the electrode portion forming position.

In this case, the insulating film which serves as the patterning film which exposes therefrom the portion of the seed film in the electrode portion forming position is provided on the electrode transfer substrate, so that the metal electrode material can selectively be deposited on the seed film by electroplating. At this time, there is no need to cover the electrode transfer substrate with an additional patterning film.

The seed film is preferably composed of such a material that the metal electrode portion has a lower adhesion affinity for the seed film than for a portion of the semiconductor substrate on which the metal electrode portion is to be transferred.

In this case, the adhesion between the metal electrode portion and the semiconductor substrate is superior to the adhesion between the metal electrode portion and the seed film. Therefore, when the semiconductor substrate and the electrode transfer substrate are pressed together and then separated from each other, the metal electrode portion can assuredly be transferred onto the semiconductor substrate. Thus, the formation of the metal electrode on the semiconductor substrate can advantageously be achieved.

The electrode transfer substrate may be composed of a transparent material, and the seed film may locally be present in the electrode portion forming position on the electrode transfer substrate.

With this arrangement, when the electrode transfer substrate is joined with the semiconductor substrate, the semiconductor substrate and the seed film can be viewed from a rear side of the electrode transfer substrate (which is opposite from a side thereof on which the metal electrode portion is formed). Since the seed film is locally present in the electrode portion forming position on the electrode transfer substrate, the electrode transfer substrate can properly be positioned with respect to the semiconductor substrate by monitoring the position of the seed film and an electrode forming position on the semiconductor substrate from the rear side of the electrode transfer substrate by proper image pick-up means. This ensures precise transfer of the metal electrode portion.

A protective film having an opening which exposes therethrough an electrical contact portion of the semiconductor substrate may be provided on the semiconductor substrate. In this case, it is preferred that the metal electrode portion is formed in a position on the electrode transfer substrate corresponding to the position of the electrical contact portion in the step of forming the metal electrode portion on the electrode transfer substrate, and the metal electrode portion is transferred onto the electrical contact portion in the step of transferring the metal electrode portion.

Thus, the metal electrode can be provided on the electrical contact portion exposed from the protective film on the semiconductor substrate.

The foregoing and other objects, features and effects of the present invention will become more apparent from the following description of the preferred embodiments with reference to the attached drawings.

DESCRIPTION OF THE PREFERRED EMBODIMENTS

Figure 1:
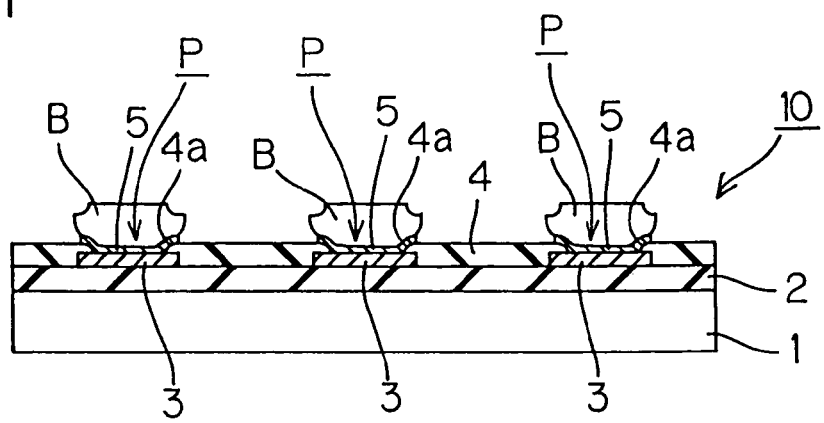
FIG. 1 is a sectional view illustrating the construction of a semiconductor chip to be produced through a process according to one embodiment of the present invention.

FIG. 1 is a sectional view illustrating the construction of a semiconductor chip to be produced through a process according to one embodiment of the present invention. The semiconductor chip 10 has a semiconductor substrate 1, an insulating film 2 formed on a surface of the semiconductor substrate 1, aluminum interconnections 3 formed on the insulating film 2, and a protective film 4 covering the aluminum interconnections 3. Openings 4a are formed in the protective film 4 above pads P (electrical contact portion) which are parts of the aluminum interconnections 3. Surface portions of the aluminum interconnections 3 exposed through the openings 4a are respectively covered with barrier metal layers 5 such as of TiW. Bumps B of an oxidation-resistant metal such as gold, palladium, titanium, silver or iridium are respectively provided on the barrier metal layers 5 as projecting therefrom.

The surface of the semiconductor substrate 1 is a surface on the side of an active surface region formed with functional devices (not shown) such as a transistor and a resistor constituting internal circuitry. The aluminum interconnections 3 are connected to the functional devices provided in the active surface region. Where a multi-level interconnection structure having plural levels of interconnections is employed, aluminum interconnections of an upper level are connected to aluminum interconnections of a lower level.

The semiconductor chip 10 having the aforesaid construction is mounted on a printed board by so-called flip-chip bonding in such a manner that the surface thereof formed with the bumps B is opposed to the printed board, or bonded to a second semiconductor chip with their faces being opposed to each other to form a semiconductor device of so-called chip-on-chip structure. In this case, the bumps B serve for electrical connection between the internal circuitry of the semiconductor chip 10 and a solid device such as the printed board or the second semiconductor chip and for mechanical bonding of the semiconductor chip 10.

Figure 2:
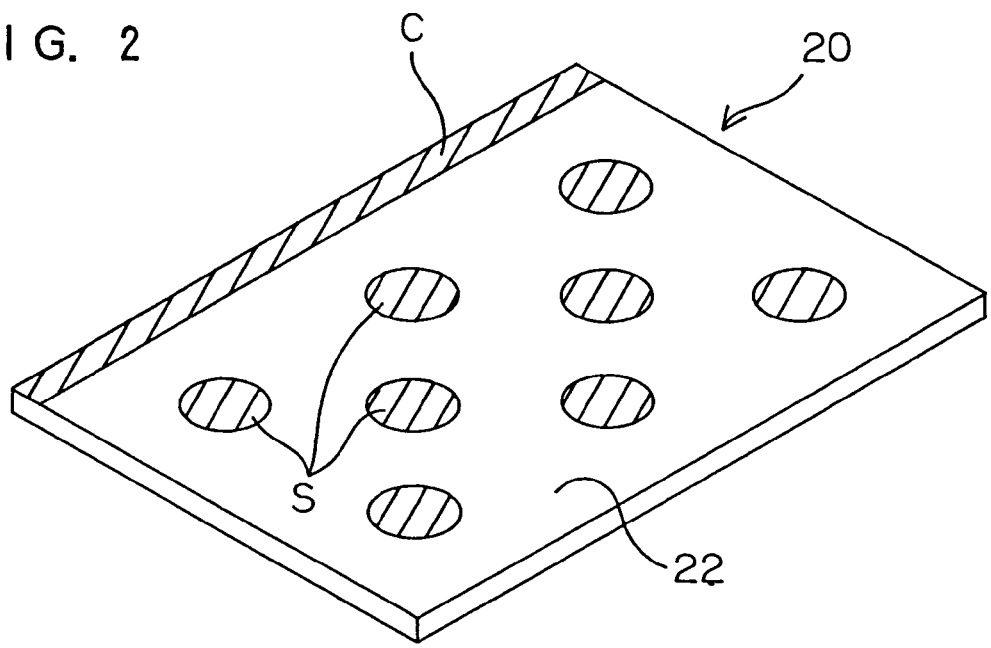
FIG. 2 is a perspective view illustrating the construction of an electrode transfer substrate which is used for formation of bumps on a surface of the semiconductor chip.
Figure 3:
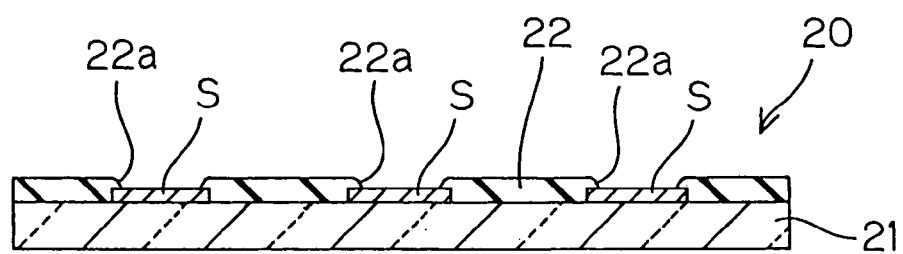
FIG. 3 is a sectional view of the electrode transfer substrate.

FIG. 2 is a perspective view illustrating the construction of a substrate 20 for electrode transfer which is used for formation of the bumps B on the surface of the semiconductor chip 10, and FIG. 3 is a sectional view thereof. In this embodiment, the formation of the bumps B is achieved by forming bump portions B on the electrode transfer substrate 20 and then transferring the bump portions B from the electrode transfer substrate 20 onto the semiconductor chip 10 by pressing together the electrode transfer substrate 20 and the semiconductor chip 10 in an opposed relation.

The electrode transfer substrate 20 comprises, for example, a rectangular glass substrate 21 having a larger plan area than the semiconductor chip 10. A plurality of seed film portions S (hatched in FIG. 2) are provided on one surface of the glass substrate 21 as exposing from an insulating film 22 having a pattern corresponding to an array of the pads P of the semiconductor chip 10.

Figure 4:
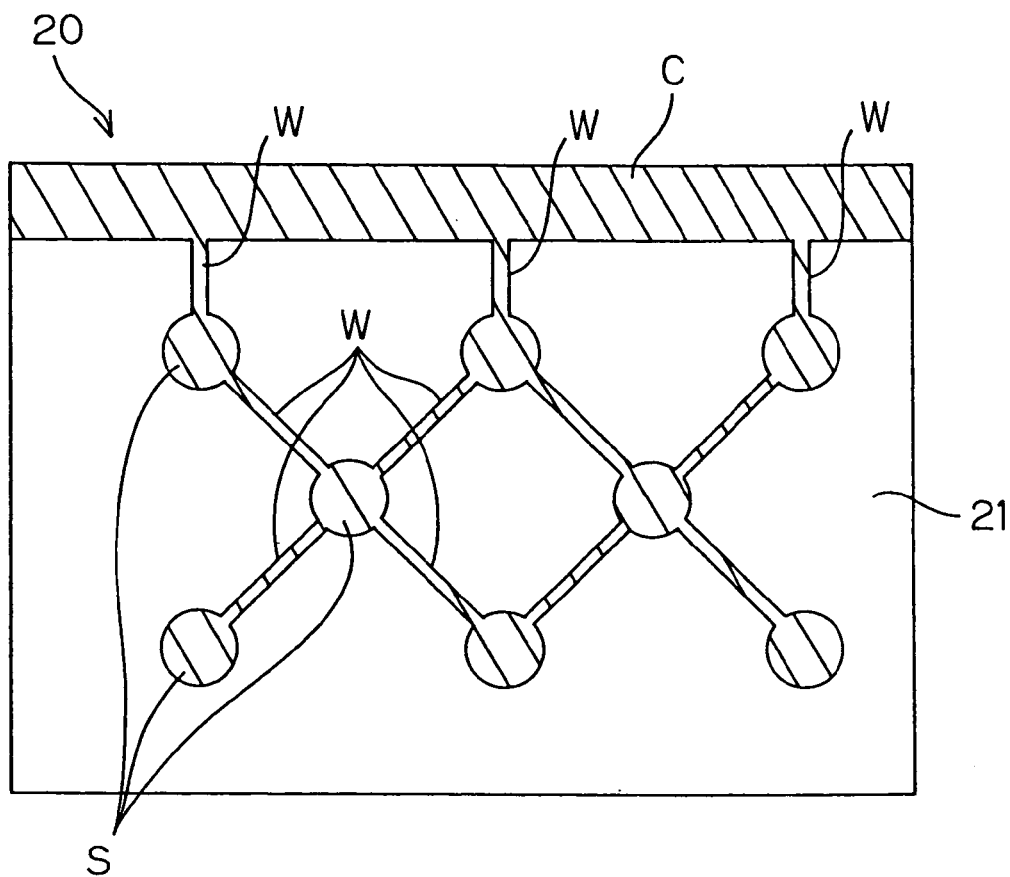
FIG. 4 is a plan view illustrating the construction of the electrode transfer substrate with an insulating film on the surface thereof being removed.

FIG. 4 is a plan view illustrating the electrode transfer substrate 20 with the insulating film 22 removed. The seed film portions S are each connected to adjacent ones via interconnection film portions W composed of the same material as the seed film portions S. An elongated electrode connector C is provided along one edge of the glass substrate 21, and connected to some of the seed film portions S located in the vicinity thereof via interconnection film portions W. Thus, all the seed film portions S are electrically connected to the electrode connector C. The electrode connector C is exposed from the insulating film 22 as shown in FIG. 2.

The insulating film 22 selectively covers peripheral edges of the seed film portions S and the interconnection film portions W, and has openings 22a which expose therethrough portions (center portions) of the seed film portions S except the peripheral edges. The insulating film 22 is composed, for example, of silicon oxide or silicon nitride.

Figure 5A:
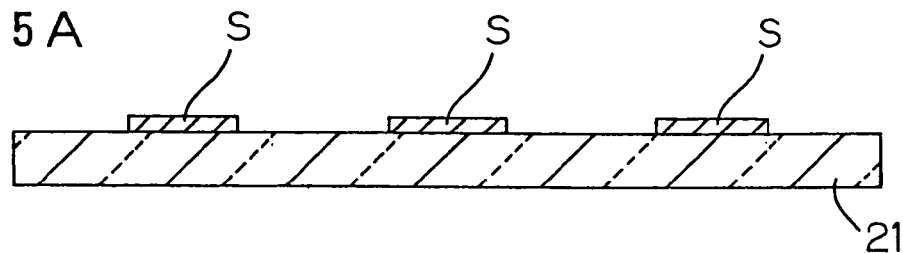
FIGS. 5A and 5B are sectional views for explaining the sequence of steps of a process for producing the electrode transfer substrate.
Figure 5B:
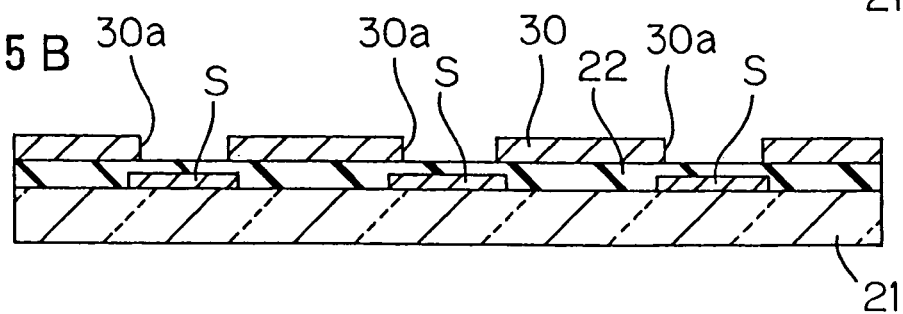

FIGS. 5A and 5B are sectional views for explaining the sequence of steps of a process for producing the electrode transfer substrate 20. The seed film portions S, the interconnection film portions W and the electrode connector C (in FIGS. 5A and 5B, the interconnection portions W and the electrode connector C are not shown) are formed on the surface of the glass substrate 21 by patterning through a known photolithography process (FIG. 5A). More specifically, a thin metal film suitable as a plating seed is deposited on the surface of the glass substrate 21, for example, by sputtering. Thereafter, a resist pattern having openings for the seed film portions S, the interconnection film portions W and the electrode connector C is formed on the resulting surface, and then the thin metal film is patterned by etching. Thus, the seed film portions S, the interconnection film portions W and the electrode connector C remain on the surface of the glass substrate 21.

In turn, the insulating film 22 is formed by a CVD (chemical vapor deposition) process as covering the entire surface of the glass substrate 21. Then, a resist film 30 having openings 30a for the seed film portions S is formed on the insulating film 22 (FIG. 5B). In this state, the resulting surface is subjected to etching by using the resist film 30 as a mask, whereby the openings 22a are formed in the insulating film 22 to expose therethrough the center portions of the seed film portions S. Then, the resist film 30 is removed. Thus, the electrode transfer substrate 20 having the construction shown in FIGS. 2 to 4 is provided.

Figure 6A:
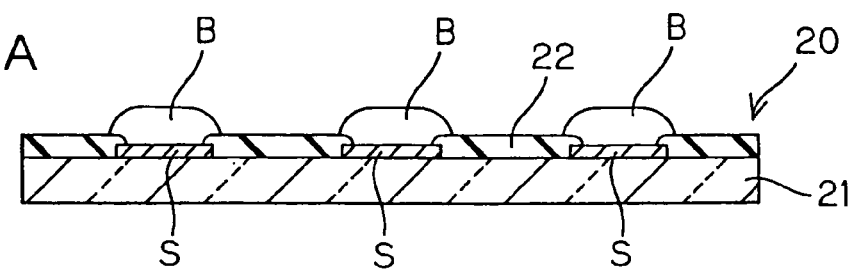
FIGS. 6A, 6B, 6C and 6D are sectional views for explaining a process for forming bumps on the semiconductor chip with the use of the electrode transfer substrate.

FIGS. 6A to 6D are sectional views for explaining a process for forming the bumps B on the semiconductor chip 10 with the use of the electrode transfer substrate 20. As shown in FIG. 6A, the bump portions B are first formed on the seed film portions S of the electrode transfer substrate 20 by electroplating. Power supply to the seed film portions S is achieved with the use of the electrode connector C.

Figure 6B:
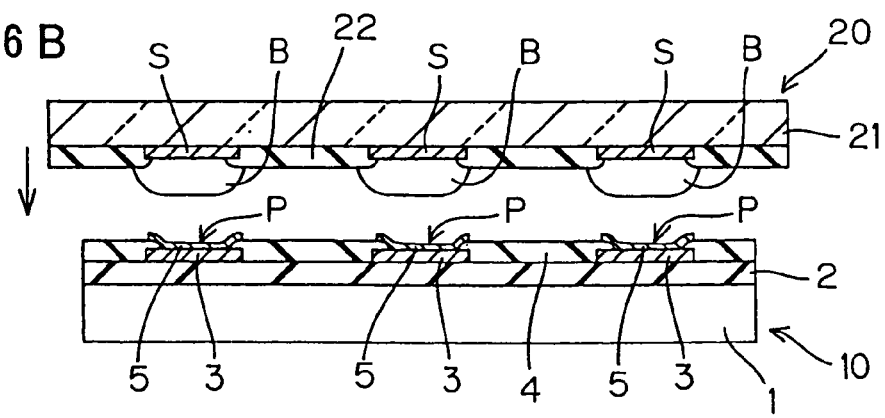

In turn, as shown in FIG. 6B, the surface of the electrode transfer substrate 20 formed with the bump portions B is opposed to a surface of a semiconductor chip 10, and then the electrode transfer substrate 20 is properly positioned with respect to the semiconductor chip 10 with the bump portions B being opposed to the corresponding pads P.

Figure 6C:
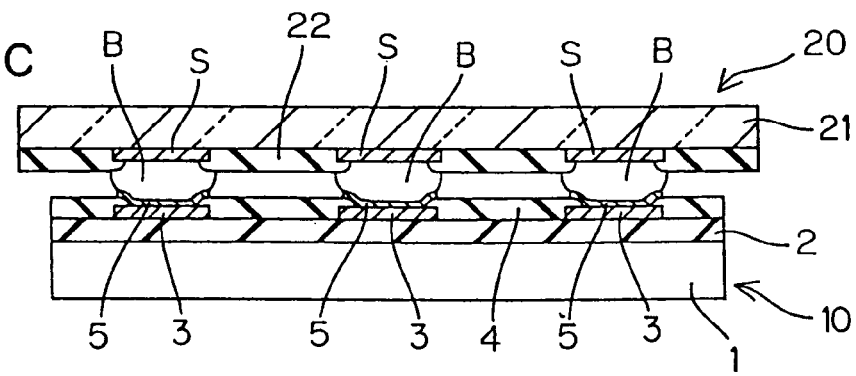

Subsequently, the bump portions B are pressed against the pads P by pressing together the electrode transfer substrate 20 and the semiconductor chip 10 as shown in FIG. 6C.

Figure 6D:
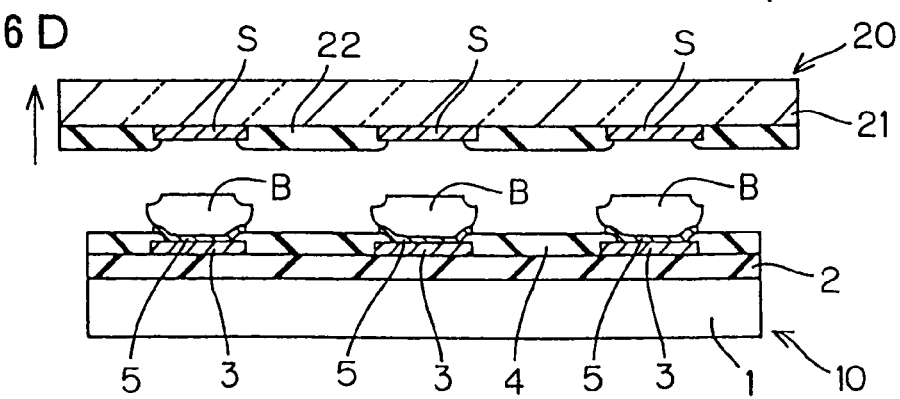

When the electrode transfer substrate 20 is thereafter separated from the semiconductor substrate 1 as shown in FIG. 6D, the bump portions B are transferred from the electrode transfer substrate 20 onto the pads P of the semiconductor chip 10. Thus, the bumps B can be formed on the surface of the semiconductor chip 10.

For proper transfer of the bumps B from the electrode transfer substrate 20 to the semiconductor chip 10, the seed film portions S are composed of such a material that the bump portions B have a lower adhesion affinity for the seed film than for the barrier metal layer 5. Where the bump portions B are composed of gold and the barrier metal layer 5 is composed of TiW, for example, the seed film portions S may be composed, for example, of Cr (chromium).

Figure 7:
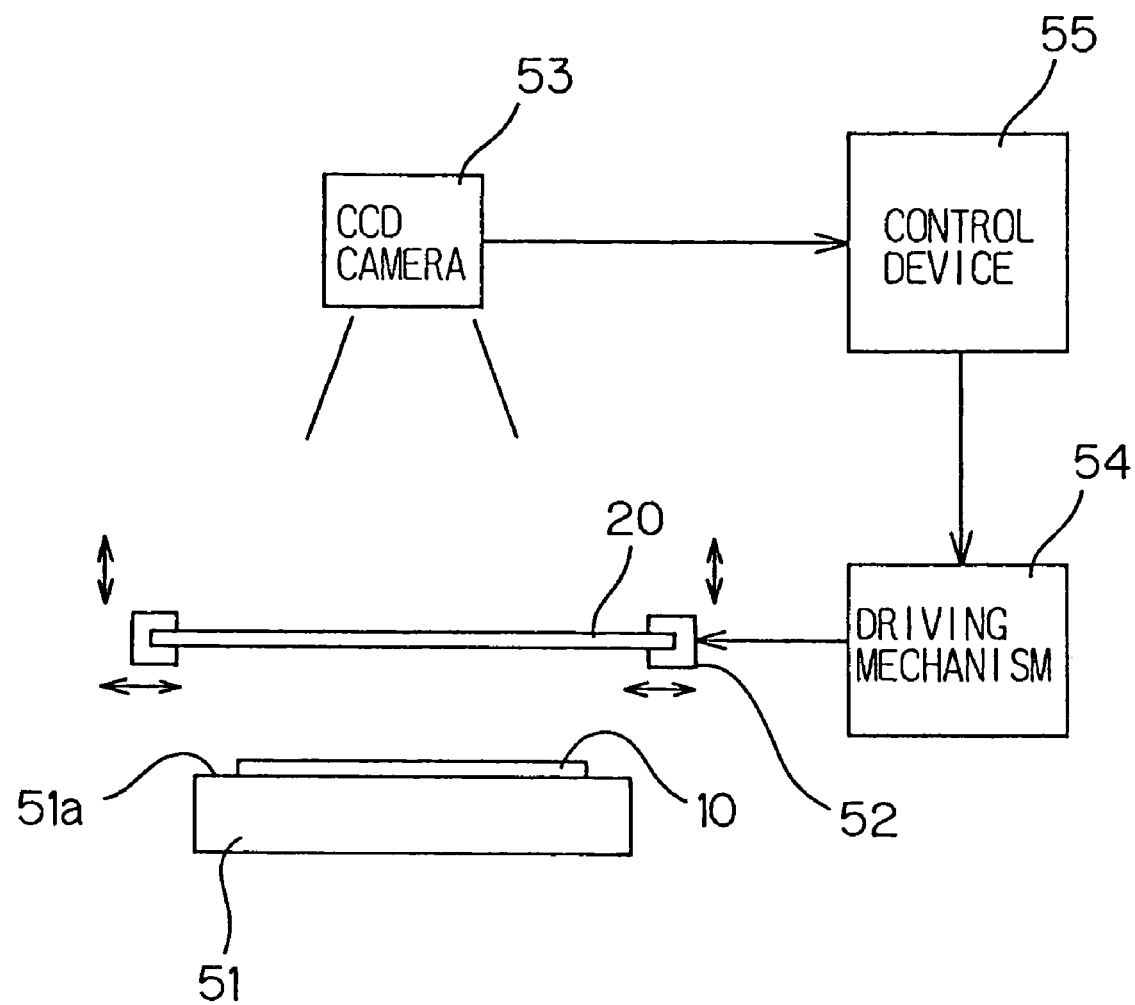
FIG. 7 is a schematic diagram for explaining the construction of an apparatus for transferring bump portions from the electrode transfer substrate to the semiconductor chip.

FIG. 7 is a schematic diagram for explaining the construction of an apparatus for transferring the bump portions B from the electrode transfer substrate 20 onto the semiconductor chip 10. The apparatus includes a chip holder 51 having a holder surface 51a for holding a semiconductor chip 10, and an electrode transfer substrate holder 52 for holding the electrode transfer substrate 20 parallel to the holding surface 51a above the chip holder 51. The electrode transfer substrate holder 52 is adapted to hold peripheral edges of the electrode transfer substrate 20 and to be moved horizontally along a horizontal plane (along the holding surface 51a) and moved vertically up and down (perpendicularly to the holding surface 51a) by the operation of a driving mechanism 54.

The glass substrate 21 which serves as a base of the electrode transfer substrate 20 is transparent, so that the semiconductor chip 10 held by the chip holder 51 can be seen through a region of the glass substrate not formed with the seed film portions S from an upper side of the electrode transfer substrate 20 (from a side opposite from the chip holder 51). A CCD camera 53 as an image pick-up device is disposed above the electrode transfer substrate 20 held by the electrode transfer substrate holder 52. The CCD camera 53 captures an image of the seed film portions S on the electrode transfer substrate 20, and further captures an image of the surface of the semiconductor chip 10 through the electrode transfer substrate 20.

An image signal outputted from the CCD camera 53 is inputted into a control device 55. The control device 55 controls the driving mechanism 54 to horizontally and vertically move the electrode transfer substrate holder 52.

The control device 55 controls the operation of the driving mechanism 54 in such a state that the semiconductor chip 10 yet to be formed with the bumps B is held by the chip holder 51 and the electrode transfer substrate 20 formed with the bump portions B is held by the electrode transfer substrate holder 52. More specifically, the driving mechanism 54 is operated, with reference to the image signal from the CCD camera 53, so that the electrode transfer substrate holder 52 is horizontally moved to align the bump portions B with the pads P as viewed in plan. That is, the electrode transfer substrate 20 is properly positioned with respect to the semiconductor chip 10 so that the bump portions B (or seed film portions S) can be projected exactly on the pads P of the semiconductor chip 10.

Further, the control device 55 controls the driving mechanism 54 to move down the electrode transfer substrate holder 52 toward the chip holder 51, whereby the bump portions B on the electrode transfer substrate holder 52 are pressed against the pads P of the semiconductor chip 10. The downward movement of the electrode transfer substrate holder 52 may be carried out simultaneously with the horizontal movement thereof for the positioning of the electrode transfer substrate 20 with respect to the semiconductor chip 10. Alternatively, the electrode transfer substrate holder 52 may be moved downward after the positioning by the horizontal movement.

Subsequently, the control device 55 controls the driving mechanism 54 to move up the electrode transfer substrate holder 52, whereby the electrode transfer substrate 20 is separated from the semiconductor chip 10. Thus, the bump portions B are transferred from the electrode transfer substrate 20 onto the semiconductor chip 10.

Thereafter, the electrode transfer substrate 20 is used again for formation of bumps on another semiconductor chip. That is, bump portions are formed again on the surface of the electrode transfer substrate 20 by plating, and then transferred on to pads of the another semiconductor chip. Thus, the electrode transfer substrate 20 can repeatedly be used for formation of bumps on a plurality of semiconductor chips.

In accordance with this embodiment, the bump portions B are formed on the electrode transfer substrate 20 and then transferred onto the semiconductor chip 10. Therefore, there is no need to subject the semiconductor substrate 1 to a complicated process for formation of the bumps B by patterning. In addition, the electrode transfer substrate 20 can repeatedly be used with no need for formation of a resist pattern and, hence, the formation of the bump portions B in a predetermined pattern can be achieved simply by subjecting the electrode transfer substrate to electroplating. Therefore, the bumps B can be formed on the semiconductor chip 10 through an extremely simplified process by properly preparing the electrode transfer substrate 20.

Further, the electrode transfer substrate 20 can be used in common for different types of semiconductor chips if the chips have the same pad arrangement.

While one embodiment of the present invention has thus been described, the invention may be embodied in any other ways. In the embodiment described above, the transfer of the bump portions B is achieved by pressing together the semiconductor chip 10 and the electrode transfer substrate 20. Otherwise, the bump portions may be transferred onto a semiconductor wafer before semiconductor chips are cut out of the semiconductor wafer. This apparently results in drastic improvement in production efficiency. In this case, an electrode transfer substrate is prepared which has a pattern of seed film portions for the plurality of semiconductor chips yet to be cut out of the semiconductor wafer. If the electrode transfer substrate has a larger size than the semiconductor wafer, the handling of the electrode transfer substrate may be facilitated when the electrode transfer substrate is moved toward the semiconductor wafer.

Although the bump portions are formed on the electrode transfer substrate by depositing the bump material by electroplating in the aforesaid embodiment, the formation of the bump portions may be achieved by electroless plating. In this case, the provision of the interconnection film portions W and the electrode connector C is obviated.

It is noted that the semiconductor substrate 1 may be composed of any of semiconductor materials including silicon semiconductor, germanium semiconductor and compound semiconductors (e.g., gallium arsenide semiconductor).

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

This application claims priority benefits under 35 USC Section 119 on the basis of Japanese Patent Application No. 11-45214 filed to the Japanese Patent Office on Feb. 23, 1999, the disclosure thereof being incorporated herein by reference.

What is claimed is:

1. A transfer substrate for electrode transfer therefrom onto a semiconductor device, comprising:
   a substrate composed of a transparent material;
   a seed film on the substrate; and
   a patterning film on the substrate, the patterning film partly covering a surface of the seed film so as to expose a metal electrode receiving portion of the seed film;
   wherein the seed film is locally present in an area including the metal electrode receiving portion and is absent from other areas of the substrate.

2. The transfer substrate according to claim 1, further comprising a metal electrode portion provided on the exposed metal electrode receiving portion of the seed film.

3. The transfer substrate according to claim 1, wherein the seed film is composed of such a material that the metal electrode portion has a lower adhesion affinity for the seed film than for a portion of the semiconductor device onto which the metal electrode portion is to be transferred.

4. The transfer substrate according to claim 1, wherein the patterning film is transparent, whereby the semiconductor substrate is visible through the transfer substrate and patterning film, whereby the transfer substrate is positionable relative to the semiconductor substrate.

5. The transfer substrate according to claim 4, wherein the patterning film is an insulating film.

6. The transfer substrate according to claim 5, wherein the insulating film comprises silicon oxide or silicon nitride.

7. The transfer substrate according to claim 1, wherein, within an area of the substrate covered by the patterning film, the seed film is locally present only in areas generally coincident with the metal electrode receiving portions and interconnection film portions interconnecting the metal electrode receiving portions, and is absent from other areas of the substrate covered by the patterning film.

* * * * *